United States Patent
Nakao et al.

Patent Number: 5,498,514
Date of Patent: Mar. 12, 1996

[54] LITHOGRAPHIC DOUBLE-COATED PATTERNING PLATE WITH UNDERCOAT LEVELLING LAYER

[75] Inventors: Taku Nakao; Hiroyuki Yamazaki; Nobuo Tokutake, all of Kanagawa; Masato Saito, Fukushima; Hidekatsu Kohara; Toshimasa Nakayama, both of Kanagawa, all of Japan

[73] Assignee: Tokyo Ohka Kogyo Co., Ltd., Tokyo, Japan

[21] Appl. No.: 287,895

[22] Filed: Aug. 9, 1994

[51] Int. Cl.$^6$ ............................................. G03C 1/815
[52] U.S. Cl. .................. 430/512; 430/166; 430/271.1; 430/510
[58] Field of Search ............................ 430/166, 510, 430/512, 271

[56] References Cited

U.S. PATENT DOCUMENTS

| | | | |
|---|---|---|---|
| 5,130,223 | 7/1992 | Nishimura et al. | 430/166 |
| 5,158,857 | 10/1992 | Shinozaki et al. | 430/166 |

FOREIGN PATENT DOCUMENTS

| | | |
|---|---|---|
| 244572A2 | 11/1987 | European Pat. Off. . |
| 62-258449 | 11/1987 | Japan . |
| 2-53058 | 2/1990 | Japan . |
| 3-114217 | 5/1991 | Japan . |
| 3-180033 | 8/1991 | Japan . |
| 3-81122 | 12/1991 | Japan . |

*Primary Examiner*—Charles L. Bowers, Jr.
*Assistant Examiner*—Christopher G. Young
*Attorney, Agent, or Firm*—Wenderoth, Lind & Ponack

[57] ABSTRACT

An improvement is proposed in a double-coated patterning plate, which consists of a substrate, an undercoat levelling layer and a photoresist layer thereon, as well as in the patterning method therewith. Different from conventional double-coated patterning plate in which the undercoat levelling layer is formed from poly(methyl methacrylate) resin, the layer in the invention is formed from a copolymeric resin of methyl methacrylate and glycidyl methacrylate in a specified copolymerization ratio and the resin is admixed with 2,2',4,4'-tetrahydroxybenzophenone. By virtue of the use of this unique resin composition for the undercoat levelling layer, the troubles due to intermixing between the undercoat levelling layer and the photoresist layer thereon can be avoided to impart the patterned resist layer with excellent properties.

3 Claims, No Drawings

LITHOGRAPHIC DOUBLE-COATED PATTERNING PLATE WITH UNDERCOAT LEVELLING LAYER

BACKGROUND OF THE INVENTION

The present invention relates to a novel lithographic double-coated patterning plate with an undercoat levelling layer and a method for forming a patterned resist layer therewith. More particularly, the invention relates to a lithographic patterning plate having, on a substrate, an undercoat levelling layer formed from a novel resinous material and a layer of a photosensitive resin composition thereon as well as to an efficient method for forming a patterned resist layer therewith.

In the technology in recent years for the manufacture of various kinds of, for example, semiconductor devices by utilizing the photolithographic patterning process, it is a remarkable trend that the degree of fineness and accuracy of patterning required is increasing year by year in order to achieve a higher and higher density of integration for which the patterning works must be performed on a surface sometimes having a stepwise level difference as a consequence of a multilayered circuit pattern. When a photolithographic resist layer is formed on such a surface having a stepwise level difference, accordingly, it is unavoidable that the surface of the resist layer is also microscopically not flat enough to greatly affect the quality of the patterned resist layer.

One of the methods disclosed in Japanese Patent Kokai 3-180033 to solve the above described problem is to use a lithographic double-layered patterning plate which is prepared by first forming an undercoating layer of a thermoplastic or thermally flowable synthetic resin such as poly(methyl methacrylate) on the surface of a substrate such as a semiconductor silicon wafer and, after heating of the undercoat layer to effect levelling of the undercoat layer imparted with perfect flatness of the surface, then forming a uniform layer of a photosensitive resist composition on the flat surface of the undercoat layer. In the use of such a double-coated patterning plate, the upper coating layer of the photosensitive resist composition is first patterned by a photolithographic method known per se to give a high-quality patterned layer which can then be used, after silylation to increase the chemical stability, as a masking in the patterning of the undercoat layer by the method of dry etching, e.g., reactive ion etching method by using oxygen gas.

This method has several disadvantages. For example, intermixing of the resinous compositions sometimes takes place between the undercoat layer formed from a poly(methyl methacrylate) and the overcoat layer formed, for example, from a novolac resin-based photosensitive resist composition unavoidably resulting in a decrease in the resolution of the pattern. Moreover, the process of silylation is very troublesome because the treatment is performed by the plasma treatment method in an atmosphere of the vapor of a silicon-containing compound as a silylating agent such as silicon tetrafluoride and silicon tetrachloride.

An alternative method disclosed in Japanese Patent Kokai 62-258449 also utilizes a double-coated patterning plate prepared by forming an undercoat photoresist layer and an overcoat photoresist layer having different sensitivities against actinic rays successively on the surface of a substrate. In this case, a first photolithographic process is undertaken to effect patterning of the overcoat layer alone by the pattern-wise exposure to light followed by a wet-process development treatment and a silylation treatment and then the undercoat layer is patterned with the patterned overcoat layer as a masking by the exposure to far-ultraviolet light followed by a development treatment.

This method, in which the undercoat layer is formed, usually, from a ternary copolymeric resin consisting of methyl methacrylate, methacrylic acid and methacrylic acid anhydride in view of the photosensitivity of the resin in the far-ultraviolet region, is also disadvantageous due to the troublesomeness of the patterning process including irradiation of the undercoat layer with far-ultraviolet light in addition to the relatively low selectivity ratio of the pattern. The selectivity ratio here implied is a ratio of the decrease in the thickness of the undercoat layer when the layer is subjected to an etching treatment to the decrease in the thickness of the overcoat layer after silylation when it is subjected to the same etching treatment as for the undercoat layer. It is desirable to have a high selectivity ratio which means that the undercoat layer can be completely removed by an etching treatment while the overcoat layer is little susceptible to the same etching treatment to retain the thickness before the etching treatment.

Japanese Patent Kokai 3-114217 and 2-53058 disclose a low-reflectance coating layer, which is used in the same purpose as in the present invention, consisting of a poly(methyl methacrylate) or poly(glycidyl methacrylate) with admixture of a dye capable of absorbing ultraviolet light. The low-reflectance coating layer using a poly(methyl methacrylate), however, has a problem that intermixing between layers is sometimes unavoidable while the layer formed by intermixing is insoluble in an alkaline aqueous solution so that the cross section of the patterned resist layer obtained therewith has trailing skirts in the profile. The coating layer by using a poly(glycidyl methacrylate) as the resinous ingredient, on the other hand, has excessively high resistance against dry etching so that the dry etching must be performed so extensively that the upper resist layer is also attacked thereby to cause a decrease in the thickness of the layer consequently resulting in rounded shoulder portions in the cross sectional profile of the patterned resist layer. Further, Japanese Patent Publication 3-81122 discloses a color filter formed by providing, on the surface of a substrate, a colored layer containing an organic coloring matter and a resinous coating layer consisting of a poly(glycidyl methacrylate) containing a benzophenone-based compound as an ultraviolet absorber. The coating layer, however, is provided in an object quite different from that of the present invention directed to the prevention of reflection of the exposure light on the substrate surface.

SUMMARY OF THE INVENTION

The present invention accordingly has an object, in view of the above described problems in the lithographic patterning technology, to provide a double-coated patterning plate of excellent levelling and a high selectivity ratio capable of giving a patterned resist layer having a high resolution without intermixing between layers along with excellent orthogonality of the patterned resist layer without notching. The invention also has an object to provide an improvement in the method for forming a patterned resist layer of high quality on the surface of a substrate even when the surface of the substrate is not flat enough and has a level difference.

Thus, the double-coated patterning plate of the invention comprises:

(a) a substrate;

(b) an undercoat levelling layer formed on the surface of the substrate; and (c) an overcoat layer of a positive-working photosensitive resist composition formed on the surface of the undercoat levelling layer, the undercoat levelling layer being formed from a thermoplastic resin composition comprising (1) a copolymer of glycidyl methacrylate and methyl methacrylate in a copolymerization ratio in the range from 2:8 to 8:2 by weight and having a weight-average molecular weight in the range from 10,000 to 200,000 and (2) 2,2',4,4'-tetrahydroxybenzophenone.

Further, the invention provides, in a method for forming a patterned resist layer on the surface of a substrate comprising the steps of:

(A) forming an undercoat layer of a thermoplastic resin composition having a flat surface on the surface of the substrate;

(B) forming an overcoat layer of a positive-working photosensitive resist composition on the surface of the undercoat layer;

(C) patterning the overcoat layer;

(D) silylating the overcoat layer patterned in step (C); and (E) removing the undercoat layer on the areas not covered by the patterned overcoat layer by dry etching, the improvement which comprises using, as the thermoplastic resin composition to form the undercoat layer, a resin composition comprising (1) a copolymer of glycidyl methacrylate and methyl methacrylate in a copolymerization ratio in the range from 2:8 to 8:2 by weight and having a weight-average molecular weight in the range from 10,000 to 200,000 and (2) 2,2',4,4'-tetrahydroxybenzophenone.

DETAILED DESCRIPTION OF THE PREFERRED EMBODIMENTS

As is described above, the most characteristic feature of the invention consists in the use of a specific thermoplastic resin composition for forming the undercoat layer in a double-coated patterning plate. The undercoat layer of the specific resin composition proposed in this invention is free from the disadvantageous phenomenon of intermixing with the positive-working photosensitive resist composition forming the overcoat layer on the undercoat layer so that the invention provides a means to form a patterned resist layer of high quality on the surface of a substrate even when the substrate surface is not flat enough but has a level difference which otherwise is detrimental against the quality of the patterned resist layer formed by the photolithographic method.

The process for the formation of a patterned resist layer comprising the above described steps (A) to (E) is generally described, for example, in Japanese Patent Kokai 3-180033 by using a poly(methyl methacrylate), referred to as PMMA hereinafter, as the thermoplastic resin composition for forming the undercoat layer. The improvement according to the invention can be obtained by replacing the above mentioned PMMA in the prior art method with a specific resin composition consisting of a copolymer of glycidyl methacrylate, referred to as GMA hereinafter, and methyl methacrylate, referred to as MMA hereinafter, in a specified copolymerization ratio having a specified weight-average molecular weight with admixture of 2,2',4,4'-tetrahydroxybenzophenone as an ultraviolet absorber.

It is essential that the copolymer of MMA and GMA as the resinous ingredient is compounded with the above mentioned specific benzophenone compound. Although it is known in the prior art that an organic resinous layer contains various kinds of ultraviolet-absorbing compounds, 2,2',4,4'-tetrahydroxybenzophenone mentioned above is specifically effective when it is combined with a copolymer of MMA and GMA in the undercoat layer for photolithographic patterning. Namely, it is a novel discovery leading to the present invention that the combination of the resinous ingredient and the ultraviolet absorber is very important in order to obtain well balanced properties of a patterned resist layer relative to the characteristics of notching, levelling, cross sectional profile of the patterned resist layer, patterning resolution, selectivity between layers and so on.

The double-coated lithographic patterning plate comprises (a) a substrate, (b) an undercoat layer of the specific thermoplastic resin composition and (c) an overcoat layer of a positive-working photosensitive resist composition which can be conventional comprising, for example, an alkali-soluble novolac resin and a photosensitizing compound. The types of the substrate materials are not particularly limitative including silicon semiconductor wafers on which multilayered circuit patterns can be formed to make a step-wise level difference as well as plates of a metal such as aluminum, tantalum and the like.

The thermoplastic resin composition to form the undercoat levelling layer on the substrate surface is based on a copolymeric resin of GMA and MMA in a copolymerization ratio in the range from 2:8 to 8:2 by weight or, preferably, from 3:7 to 7:3 by weight. The copolymeric resin should have a weight-average molecular weight in the range from 10,000 to 200,000 or, preferably, from 20,000 to 100,000 determined, for example, by making reference to polystyrenes of defined molecular weights. When the weight-average molecular weight of the copolymeric resin does not fall within the above defined range, adverse influences are caused in the quality of the patterned resist layer in respects of the resolution and orthogonality in the cross sectional profile of the line-patterned resist layer as a consequence of increased intermixing between layers and decrease in the levelling behavior as well as decrease in the selectivity ratio. Such a copolymeric resin of GMA and MMA can be easily prepared according to a known procedure of free-radical polymerization by heating a polymerization mixture consisting of GMA and MMA in a specified weight proportion in the presence of a free-radical polymerization initiator such as α,α'-azobisisobutyronitrile with or without an organic solvent.

It is essential that the copolymeric resin of GMA and MMA is admixed with an ultraviolet absorber, which is preferably 2,2',4,4'-tetrahydroxybenzophenone, to give the thermoplastic resin composition as the material of the undercoat layer on the substrate surface. The amount of the ultraviolet absorber to be contained in the thermoplastic resin composition is, though not particularly limitative depending on the reflectivity of the substrate surface on which the undercoat layer is formed, in the range from 10 to 100% by weight or, preferably, from 20 to 80% by weight based on the amount of the copolymeric resin of GMA and MMA. Admixture of an ultraviolet absorber to the copolymeric resin is particularly important when the substrate surface has a high reflectivity to ultraviolet light as on an aluminum surface since reelection of the ultraviolet light on the substrate surface can be decreased thereby to prevent extraneous and localized exposure of the overcoat layer resulting in notching development along with a temperature increase to effect thermal crosslinking reaction resulting in a decrease in the intermixing between layers.

In step (A) of the process according to the invention, the surface of a substrate, such as a semiconductor silicon wafer and a plate of aluminum, tantalum or other metals, is coated with the thermoplastic resin composition in the form of a solution prepared by dissolving the above described copolymeric resin of GMA and MMA and 2,2',4,4'-tetrahydroxybenzophenone in a suitable organic solvent in a concentration suitable for coating followed by evaporation of the solvent to form a dried undercoat layer which should have a thickness in the range, though not particularly limitative, from 0.5 to 1.5 μm after drying depending on the condition of the substrate surface. Examples of the organic solvent suitable for the preparation of the coating composition include ketones such as acetone, methyl ethyl ketone, cyclohexanone, methyl isoamyl ketone and 1,1,1-trimethyl acetone, polyhydric alcohols and derivatives thereof such as ethyleneglycol, ethyleneglycol monoacetate, monomethyl, monoethyl, monopropyl, monobutyl and monophenyl ethers of ethyleneglycol, ethyleneglycol monoacetate, diethyleneglycol and diethyleneglycol monoacetate, and esters such as ethyl lactate, methyl acetate, ethyl acetate, butyl acetate, methyl pyruvate, ethyl pyruvate, methyl 2-methoxypropionate and ethyl 3-ethoxypropionate. These solvents can be used either singly or as a combination of two kinds or more according to need.

Assuming that the substrate surface is not flat enough but has a step-wise level difference, it is important to effect levelling of the undercoat layer by heating the thermoplastic resin composition at a temperature of, for example, 170° to 200° C. at which the resin composition is flowable.

In step (B) of the process according to the invention, an overcoat layer of a positive-working photosensitive resist composition is formed on the above obtained undercoat layer. The type of the positive-working photosensitive resist composition is not particularly limitative including those conventionally used in the photolithographic patterning works for the manufacture of electronic devices although the composition preferably comprises an alkali-soluble crosslinkable resin and a photosensitizing compound such as a quinone diazide group-containing compound.

Examples of the alkali-soluble resin mentioned above include novolac resins, acrylic resins, copolymers of styrene and acrylic acid, polymers of hydroxystyrene, polyvinylphenols, poly(α-methyl vinylphenols) and the like, of which preferred in respect of the good resistance against dry etching as compared with other resins are alkali-soluble novolac resins prepared from an aromatic hydroxy compound such as phenol, cresol and xylenol and an aldehyde compound such as formaldehyde and having a weight-average molecular weight in the range from 2000 to 20000 or, more preferably, from 5000 to 15000 after removal of the low molecular-weight fractions by fractionation.

Examples of the quinone diazide group-containing compounds as the above mentioned photosensitizing compound include products by a full or partial esterification or amidation reaction between a quinone diazide group-containing sulfonic acid such as o-benzoquinone diazide sulfonic acid, o-naphthoquinone diazide sulfonic acid and o-anthraquinone diazide sulfonic acid and the like and a phenolic hydroxyl group- or amino group-containing compound. The phenolic hydroxyl group- or amino group-containing compound is exemplified by polyhydroxy benzophenone compounds such as 2,3,4-trihydroxy benzophenone, 2,2',4,4'-tetrahydroxy benzophenone, 2,3,4,4'-tetrahydroxy benzophenone; alkyl gallates, aryl gallates, phenol, phenolic resins, 4-methoxy phenol, dimethyl phenols, hydroquinone, polyhydroxydiphenyl alkanes, polyhydroxydiphenyl alkenes, bisphenol A, α,α',α"-tris( 4-hydroxyphenyl)-1,3,5-triisopropylbenzene, 1-[1-(4-hydroxyphenyl)isopropyl] -4-[1,1-bis(4-hydroxyphenyl)ethyl] benzene, tris(hydroxyphenyl) methane compounds as well as methyl-substituted derivatives thereof; naphthols, pyrocatechol, pyrogallol, pyrogallol monomethyl ether, pyrogallol 1,3-dimethyl ether, gallic acid and partial esterification or etherification products thereof, aniline, 4-amino diphenyl amine and the like. Particularly preferable photosensitizing compounds are esterification products of a polyhydroxy benzophenone and naphthoquinone-1,2-diazide-5- or -4-sulfonic acid of which the degree of esterification is at least 70%. These compounds can be prepared according to a known procedure from the polyhydroxy benzophenone and a sulfonyl chloride corresponding to the above mentioned sulfonic acid in the presence of an alkali as the catalyst.

The photosensitive resin composition can be prepared by uniformly dissolving the above described alkali-soluble resin and the photosensitive compound in a suitable organic solvent. Examples of suitable organic solvents include those given as the examples of the organic solvent for the copolymeric resin of GMA and MMA as well as certain cyclic ethers such as dioxane and the like.

It is of course optional that the positive-working photosensitive resin composition is admixed according to need with various kinds of known additives having compatibility such as auxiliary resins, plasticizers and stabilizers to improve the properties of the resist layer and coloring agents to improve visibility of the patterned resist layer as well as auxiliary sensitizers.

Step (B) of the process according to the invention is performed by coating the surface of the undercoat levelling layer formed in step (A) with the thus prepared photosensitive resin composition to form a resist layer by using a suitable coating machine such as a spinner in a coating thickness of from 1.0 to 3.0 μm as dried.

In step (C) of the process according to the invention, the thus formed photoresist layer is photolithographically patterned. The procedure of patterning can be conventional including the steps of pattern-wise exposure to ultraviolet light from a light source such as mercury lamps, arc lamps, xenon lamps and the like through a photomask bearing a desired pattern or pattern-wise irradiation with electron beams scanned along a desired pattern and a development treatment with an aqueous alkaline developer solution such as an aqueous solution of tetramethyl ammonium hydroxide in a concentration of 1 to 10% by weight to selectively dissolve away the solubilized resin composition on the exposed or irradiated areas of the resist layer so that the surface of the undercoat levelling layer is exposed bare.

Step (D) to follow the above described patterning procedure as step (C) is for silylation of the patterned resist layer which can be performed by exposing the patterned resist layer to the vapor of a silylating agent which is preferably a silazane compound such as hexamethyl disilazane, hexamethyl cyclotrisilazane and the like at a temperature in the range from 30° to 100° C. for 1 to 60 minutes.

In the next place, a dry etching treatment is undertaken in step (E) on the coating layers after the above described silylating treatment in order to remove the undercoat layer in the areas where the layer is exposed bare by the photolithographic patterning of the overcoat photoresist layer in step (C). A convenient process for conducting dry etching is the plasma etching method in a low-pressure atmosphere of oxygen or a gaseous mixture of oxygen and a fluorocarbon compound such as trifluoromethane, tetrafluoromethane, octafluoropropane, decafluorobutane and the like. The patterned photoresist layer is not affected by this dry etching treatment by virtue of the increased resistance against dry etching imparted by the silylation treatment so that a patterned resist layer as finished has excellent orthogonality in the cross sectional profile with high resolution and high selectivity.

In the following, the double-coated patterning plate of the invention as well as the patterning method by utilizing the same are illustrated in more detail by way of examples and comparative examples, in which the evaluation of the experimental results were performed for the following items each by the testing procedure described there.

(1) Selectivity ratio

A substrate was coated with the undercoat levelling composition followed by drying to form a levelling layer having a thickness of about 0.5 μm and the layer was subjected to the dry etching treatment to record the etching rate x, i.e. the decrease of the layer thickness in a unit time. Separately, a positive-working photoresist layer having a thickness of 1.26 μm was formed on the undercoat levelling layer which was subjected to the same dry etching treatment as above to record the etching rate y, i.e. the decrease of the layer thickness in a unit time. The selectivity ratio is expressed by the ratio of x:y.

(2) Intermixing of layers

A cross section of the test specimen provided with an undercoat levelling layer and a top-coat layer of a photoresist composition was examined with a scanning electron microscope and the result was recorded as Poor or Good when an intermixing layer was found or not found, respectively, along the interface of the two layers.

(3) Notching

The patterned resist layer on the substrate surface was visually examined for the linearity of several patterned lines and the result was recorded as Poor or Good when distortion of the lines was detected or not detected, respectively.

(4) Levelling

A cross section of the test specimen was examined with a scanning electron microscope and the result was recorded as Good or Poor when the line showing the upper surface of the undercoat levelling layer was straightly linear or wavy, respectively, in the cross section.

(5) Cross sectional profile

A cross section of the patterned resist layer was examined with a scanning electron microscope and the result was recorded as Good or Poor when the cross sectional profile of the line pattern was orthogonal or the shoulder portions of the cross sectional profile of the line pattern had rounded shoulders or trailing skirts, respectively.

EXAMPLE 1

A copolymer of GMA and MMA was prepared by dissolving each 100 g of GMA and MMA in 200 g of methyl ethyl ketone with admixture of 2 g of α,α'-azobisisobutyronitrile and heating the mixture for about 7 hours at 60° C. under an atmosphere of nitrogen with agitation to effect copolymerization of GMA and MMA. After completion of the copolymerization reaction, the reaction mixture was poured into 1 liter of methyl alcohol under agitation to form precipitates of the copolymer which were collected by filtration and dried at room temperature under reduced pressure to obtain 150 g of the copolymer as the product which had a weight-average molecular weight of about 100000 and a dispersion factor of 1.7 in the molecular weight.

In the next place, a 10 g portion of the above obtained copolymer of GMA and MMA was dissolved in 100 g of ethyleneglycol monomethyl ether acetate together with 3 g of 2,2',4,4'-tetrahydroxy benzophenone to form a solution which was filtered through a membrane filter to remove suspended solid matters. The thus obtained solution was used as a coating liquid for the undercoat levelling layer.

A semiconductor silicon wafer of 6 inches diameter provided with a vapor-deposited aluminum layer on the surface was coated with the above prepared undercoating liquid composition on a spinner followed by baking at 180° C. for 5 minutes to form an undercoat levelling layer having a thickness of about 0.5 μm. Further, a positive-working photoresist layer having a thickness of about 1.26 μm was formed on the above formed undercoat levelling layer with a commercial product of positive-working photoresist composition (THMRip2800, a product by Tokyo Ohka Kogyo Co.) by using a spinner followed by baking at 90° C. for 90 seconds. The photoresist layer was patterned according to a conventional procedure by the pattern-wise exposure to ultraviolet light through a pattern-bearing photomask on an exposure machine (Model NSR-1505i7A, manufactured by Nikon Co.) followed by a development treatment by paddling in a 2.38% aqueous solution of tetramethyl ammonium hydroxide at 23° C. for 65 seconds.

The silicon wafer with the double-coating layer after patterning of the top-coat layer as described above was subjected to a silylation treatment in a closed vessel by the exposure to the vapor of hexamethyl disilazane (OAP, a product by Tokyo Ohka Kogyo Co.) at 70° C. for 15 minutes. This silylation treatment was followed by a plasma-etching treatment of the coating layer in a plasma-etching apparatus (Model TCA-2400, manufactured by Tokyo Ohka Kogyo Co.) for 30 seconds of the etching time at a stage temperature of 60° C. with an electric power output of 300 watts in an atmosphere of a 2:1 by volume gaseous mixture of trifluoromethane and oxygen as the reactive gas under a pressure of 0.80 Torr.

The selectivity ratio calculated from the thickness of the residual film after the dry etching treatment was 6.0. The patterned upper resist layer had an excellently orthogonal cross sectional profile. Further, examinations were undertaken for the intermixing between the lower levelling layer and the upper resist layer, notching, i.e. deformation of the resist pattern by the reflection of the exposure light on the substrate surface, and levelling to give quite satisfactory results in each of these items as shown in Table 1 below.

COMPARATIVE EXAMPLES 1 AND 2

The experimental procedure in these comparative examples was substantially the same as in Example 1 except that the resinous ingredient in the undercoating levelling composition was a homopolymeric poly(methyl methacrylate) or poly(glycidyl methacrylate) in Comparative Examples 1 and 2, respectively. The homopolymeric resins each had a weight-average molecular weight of about 80000. The results of the evaluation tests are shown also in Table 1.

COMPARATIVE EXAMPLE 3

The experimental procedure was substantially the same as in Example 1 excepting omission of the silylation treatment with hexamethyl disilazane. The results of the evaluation tests are shown also in Table 1.

COMPARATIVE EXAMPLES 4 AND 5

The experimental procedure in these comparative examples was substantially the same as in Comparative Example 3 except that the resinous ingredient in the undercoating levelling composition was a homopolymeric poly(methyl methacrylate) or poly(glycidyl methacrylate) in Comparative Examples 4 and 5, respectively, each having a weight-average molecular weight of about 80000. The results of the evaluation tests are shown also in Table 1.

EXAMPLES 2 TO 4

The experimental procedure was substantially the same as in Example 1 except that the resinous ingredients in the undercoat levelling composition in Examples 2 and 3 were: a 7:3 by weight copolymer of MMA and GMA having a weightaverage molecular weight of 150000; and a 3:7 by weight copolymer of MMA and GMA having a weightaverage molecular weight of 60000; respectively, and the amounts of 2,2',4,4'-tetrahydroxybenzophenone were 1.5 g, 1.5 g and 0.5 g in Examples 2, 3 and 4, respectively. The results of the evaluation tests are also shown in Table 1.

COMPARATIVE EXAMPLES 6 AND 7

The experimental procedure was substantially the same as in Example 1 except that the copolymeric resin of MMA and GMA as the resinous ingredient in the undercoat levelling composition had a weight-average molecular weight of 300000 and 5000 in Comparative Examples 6 and 7, respectively. The results of the evaluation tests are also shown in Table 1.

COMPARATIVE EXAMPLE 8

The experimental procedure was substantially the same as in Example 1 excepting omission of 2,2',4,4'-tetrahydroxybenzophenone in the formulation of the undercoat levelling composition. The results of the evaluation tests are also shown in Table 1.

COMPARATIVE EXAMPLE 9

The experimental procedure was substantially the same as in Example 1 excepting replacement of 3 g of 2,2',4,4'-tetrahydroxybenzophenone with 1.0 g of 2,4,5-trihydroxybenzophenone in the formulation of the undercoat levelling composition. The results of the evaluation tests are also shown in Table 1.

TABLE 1

|  |  | Selectivity ratio | Intermixing | Notching | Levelling | Cross sectional profile |
| --- | --- | --- | --- | --- | --- | --- |
| Example | 1 | 6.0 | Good | Good | Good | Good |
|  | 2 | 6.1 | Good | Good | Good | Good |
|  | 3 | 5.7 | Good | Good | Good | Good |
|  | 4 | 6.0 | Good | Good | Good | Good |
| Comparative Example | 1 | 6.0 | Poor | Good | Good | Poor |
|  | 2 | 5.0 | Good | Good | Good | Poor |
|  | 3 | 4.1 | Good | Good | Good | Poor |
|  | 4 | 4.2 | Poor | Good | Good | Poor |
|  | 5 | 2.8 | Good | Good | Good | Poor |
|  | 6 | 6.1 | Good | Good | Poor | Poor |
|  | 7 | 5.9 | Poor | Good | Good | Poor |
|  | 8 | 5.7 | Poor | Poor | Good | Poor |
|  | 9 | 5.8 | Poor | Good | Good | Poor |

What is claimed is:

1. A double-coated patterning plate which comprises, as an integral body:

(a) a substrate;

(b) an undercoat levelling layer formed on the surface of the substrate; and (c) an overcoat layer of a positive-working photosensitive resist composition formed on the surface of the undercoat levelling layer, the undercoat levelling layer being formed from a thermoplastic resin composition comprising (1) a copolymer of glycidyl methacrylate and methyl methacrylate in a copolymerization ratio in the range from 2:8 to 8:2 by weight and having a weight-average molecular weight in the range from 10,000 to 200,000 and (2) 2,2',4,4'-tetrahydroxybenzophenone.

2. The double-coated patterning plate as claimed in claim 1 in which the amount of 2,2',4,4'-tetrahydroxybenzophenone is in the range from 10 to 100% by weight based on the amount of the copolymer of glycidyl methacrylate and methyl methacrylate.

3. The double-coated patterning plate as claimed in claim 1 in which the undercoat levelling layer has a thickness in the range from 0.5 to 1.5 μm.

* * * * *

UNITED STATES PATENT AND TRADEMARK OFFICE
CERTIFICATE OF CORRECTION

PATENT NO. : 5,498,514
DATED : March 12, 1996
INVENTOR(S) : Taku NAKAO et al.

It is certified that error appears in the above-indentified patent and that said Letters Patent is hereby corrected as shown below:

On the title page, item [73]:

In the information regarding Assignee, please change "Tokyo Ohka Kogyo Co., Ltd., Tokyo, Japan" to --Tokyo Ohka Kogyo Co., Ltd., Kawasaki, Japan--.

Signed and Sealed this

Eighteenth Day of June, 1996

Attest:

BRUCE LEHMAN

*Attesting Officer*  *Commissioner of Patents and Trademarks*